United States Patent
Yamazaki

(10) Patent No.: US 8,531,239 B2
(45) Date of Patent: Sep. 10, 2013

(54) DIFFERENTIAL AMPLIFYING APPARATUS

(75) Inventor: Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 13/356,592

(22) Filed: Jan. 23, 2012

(65) Prior Publication Data

US 2012/0206197 A1  Aug. 16, 2012

(30) Foreign Application Priority Data

Feb. 16, 2011  (JP) .................................. 2011-031265

(51) Int. Cl.
  *H03F 1/02* (2006.01)
  *H03K 17/00* (2006.01)
  *H03L 5/00* (2006.01)

(52) U.S. Cl.
  USPC ................. 330/9; 327/124; 327/307

(58) Field of Classification Search
  USPC ................. 330/9, 51; 327/124, 307
  See application file for complete search history.

(56) References Cited

U.S. PATENT DOCUMENTS

| | | | | |
|---|---|---|---|---|
| 6,724,248 B2 * | 4/2004 | Llewellyn | ........................... | 330/9 |
| 7,459,966 B2 | 12/2008 | Nakao | ................................. | 330/9 |
| 7,521,971 B2 | 4/2009 | Yamazaki | ........................ | 327/112 |
| 7,906,998 B2 | 3/2011 | Yamazaki | ........................ | 327/157 |
| 8,085,098 B2 | 12/2011 | Yamazaki | ........................ | 331/10 |
| 2008/0246544 A1 | 10/2008 | Fujino et al. | ................... | 330/278 |
| 2009/0128194 A1 | 5/2009 | Dzahini | .......................... | 327/89 |
| 2011/0133800 A1 | 6/2011 | Yamazaki | ........................ | 327/157 |

FOREIGN PATENT DOCUMENTS

| | | |
|---|---|---|
| EP | 1471646 | 10/2004 |
| JP | 2006-311350 | 11/2006 |

OTHER PUBLICATIONS

European Search Report dated Jun. 19, 2012 in corresponding European Application No. 12152605.7.
U.S. Appl. No. 13/365,220, filed Feb. 2, 2012, by Y. Yamazaki.

* cited by examiner

*Primary Examiner* — Robert Pascal
*Assistant Examiner* — Khiem Nguyen
(74) *Attorney, Agent, or Firm* — Fitzpatrick, Cella, Harper & Scinto

(57) ABSTRACT

A differential amplifier amplifies the difference between a signal input to the non-inverting terminal via a capacitor and a signal input to the inverting terminal. A switch switches whether to input the signal to the non-inverting terminal via the capacitor. A resistance is connected between the non-inverting terminal and the inverting terminal. An offset voltage corrector corrects the offset voltage of the differential amplifier based on the output signal of the differential amplifier during a correction period in which the switch is controlled not to input the signal to the non-inverting terminal via the capacitor.

9 Claims, 3 Drawing Sheets

US 8,531,239 B2

DIFFERENTIAL AMPLIFYING APPARATUS

BACKGROUND OF THE INVENTION

1. Field of the Invention

The present invention relates to a differential amplifying apparatus and, more particularly, to correction of the offset voltage of a differential amplifying apparatus.

2. Description of the Related Art

A delta-sigma (ΔΣ) A/D converter is known as a type of analog to digital (A/D) converters. When a signal having a direct-current (DC) component is input to a low-order ΔΣ A/D converter with a simple configuration, a signal having periodicity is superimposed on the digital signal output from the ΔΣ A/D converter. This periodic signal serves as "tonal noise" with a frequency changing depending on the magnitude of the DC component, and remarkably degrades the signal-to-noise (S/N) ratio.

To suppress the "tonal noise", the DC component of the signal to be input to the ΔΣ A/D converter is made sufficiently small to lower the frequency of the "tonal noise" below the frequency band to be used. When using the output signal of a differential amplifier as the analog input signal to the ΔΣ A/D converter, the offset voltage output from the differential amplifier needs to be suppressed.

To suppress the output offset voltage of a differential amplifier, a technique disclosed in, for example, Japanese Patent Laid-Open No. 2006-311350 (literature 1) is usable. The offset corrector described in the literature 1 corrects the output offset voltage of a differential amplifier based on the voltage output from the differential amplifier when the inverting terminal and the non-inverting terminal of the differential amplifier are short-circuited by a switch without any feedback from the output to the input. That is, during the offset voltage correction period, the differential amplifier is operated while short-circuiting its two input terminals, and the offset is corrected based on the output voltage at that time. This operation enables to reduce the output offset voltage of the differential amplifier.

However, during the normal operation period after the offset correction period, the two input terminals of the differential amplifier are disconnected by the switch. The differential amplifier amplifies the difference signal between the input signals of the two input terminals and outputs the amplified signal. That is, the offset voltage between the input signals of the two input terminals cannot be corrected during the normal operation period. In other words, during the normal operation period, the offset voltage between the input signals of the two input terminals is amplified and therefore cannot be sufficiently corrected.

SUMMARY OF THE INVENTION

In one aspect, a differential amplifying apparatus comprising: a differential amplifier which amplifies a difference between a signal input to a first input terminal via a capacitor and a signal input to a second input terminal; a switch which switches whether to input the signal to the first input terminal via the capacitor; a resistance which is connected between the first input terminal and the second input terminal; a corrector which corrects an offset voltage of the differential amplifier based on an output signal of the differential amplifier during a correction period in which the switch is controlled not to input the signal to the first input terminal via the capacitor.

According to the aspect, it is possible to sufficiently suppress the offset voltage output from the differential amplifying apparatus.

Further features of the present invention will become apparent from the following description of exemplary embodiments with reference to the attached drawings.

DESCRIPTION OF THE EMBODIMENTS

Figure 1:
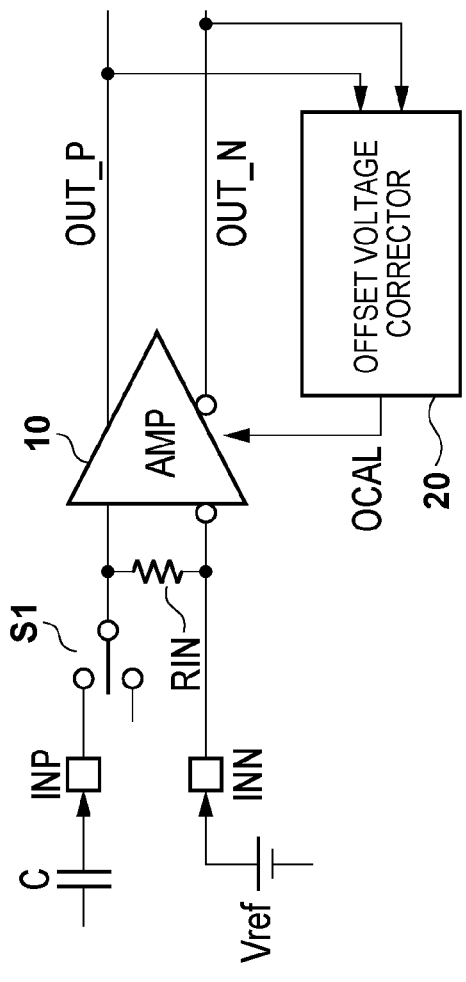
FIG. 1 is a block diagram for explaining the arrangement of a differential amplifying apparatus according to the first embodiment.

A differential amplifying apparatus according to an embodiment of the present invention will now be described in detail with reference to the accompanying drawings.

[Configuration of Differential Amplifying Apparatus]

The configuration of the differential amplifying apparatus according to the embodiment will be described with reference to the block diagram of FIG. 1.

A switch S1 and an input resistance RIN are connected to the first input terminal (non-inverting terminal; to be referred to as a +IN terminal hereinafter) of a differential amplifier 10 shown in FIG. 1. The switch S1 connects/disconnects the +IN terminal to/from a signal input terminal (to be referred to as an INP terminal hereinafter). A signal input terminal (to be referred to as an INN terminal hereinafter) and the input resistance RIN are connected to the second input terminal (inverting terminal; to be referred to as a −IN terminal hereinafter) of the differential amplifier 10. That is, the +IN terminal and the −IN terminal are connected via the input resistance RIN. Note that the resistance value of the input resistance RIN is much smaller than an input resistance value $R_{+IN}$ of the +IN terminal and an input resistance value $R_{-IN}$ of the −IN terminal of the differential amplifier 10 ($R_{-IN}$, $R_{+IN} \gg$ RIN).

The differential amplifier 10 has a first output terminal (positive output terminal; to be referred to as an OUT_P terminal hereinafter) and a second output terminal (negative output terminal; to be referred to as an OUT_N terminal hereinafter) that outputs the inverted signal of the signal of the OUT_P terminal. The input terminals of an offset voltage corrector 20 are connected to the OUT_P terminal and the OUT_N terminal, respectively. An output OCAL of the offset voltage corrector 20 is connected to the offset correction input terminal of the differential amplifier 10.

The differential amplifying apparatus normally amplifies the difference signal between the input signal of the INP terminal and that of the INN terminal. This period will be referred to as a "normal operation period". During the normal operation period, the switch S1 is controlled to connect the INP terminal and the +IN terminal.

During the normal operation period, a reference voltage Vref is input to the INN terminal, and a signal is input to the INP terminal via a capacitor C. The input signal of the INP terminal causes capacitive coupling by the input resistance RIN based on the reference voltage Vref of the INN terminal and is input to the +IN terminal of the differential amplifier 10. The differential amplifier 10 outputs, from the OUT_P terminal and the OUT_N terminal, signals obtained by amplifying the difference signal between the input signal of the +IN terminal and that (reference voltage Vref) of the −IN terminal.

On the other hand, during a period (to be referred to as a correction period hereinafter) to correct the offset voltage, the switch S1 is controlled to disconnect the INP terminal from the +IN terminal.

During the correction period, when the reference voltage Vref is input to the INN terminal, it is also input to the +IN terminal via the input resistance RIN. Since identical signals are input to the +IN terminal and the −IN terminal, signals resulting from the offset of the differential amplifier 10 are output from the OUT_P terminal and the OUT_N terminal.

During the correction period, the offset voltage corrector 20 receives the output signals from the OUT_P terminal and the OUT_N terminal and outputs the correction signal OCAL to eliminate the difference between the output signal of the OUT_P terminal and that of the OUT_N terminal. The differential amplifier 10 corrects the offset based on the correction signal OCAL. Note that the offset voltage corrector 20 maintains the correction signal OCAL even during the normal operation period after the correction period.

As described above, when the correction period is provided before the normal operation period, the differential amplifying apparatus can perform accurate differential amplification without the offset voltage of the differential amplifier 10 during the normal operation period.

Note that although a fully-differential amplifier has been described above as an example of the differential amplifier 10, a single output differential amplifier may also be used. In this case, the offset voltage corrector 20 outputs the correction signal OCAL to reduce the difference between the voltage to be output in the absence of an input signal and the voltage to be output from the differential amplifier during the correction period.

During the normal operation period, the INP terminal and the INN terminal are connected via the input resistance RIN. Hence, the offset component (Dc component) between the signal input to the INP terminal and that input to the INN terminal is cut by the capacitor C. In addition, the input resistance RIN generates a DC short circuit between the +IN terminal and the −IN terminal. For this reason, the reference potentials of the two terminals match, and the offset component is removed.

[Another Configuration of Differential Amplifying Apparatus]

Another configuration of the differential amplifying apparatus will be described with reference to the block diagram of FIG. 2.

Figure 2:
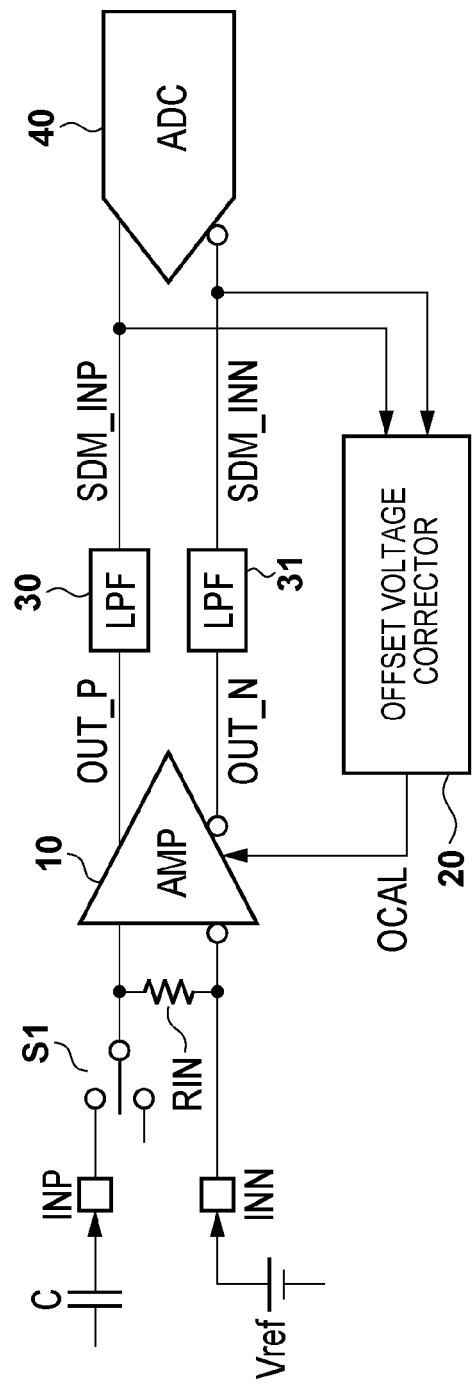
FIG. 2 is a block diagram for explaining another arrangement of the differential amplifying apparatus.

As shown in FIG. 2, the connection between the output terminals of a differential amplifier 10 and an offset voltage corrector 20 according to the second embodiment is different from that of the first embodiment. That is, the OUT_P terminal is connected to the input terminal of a low pass filter (LPF) 30, and the OUT_N terminal is connected to the input terminal of an LPF 31. The output terminal of the LPF 30 is connected to the non-inverting terminal of a ΔΣ analog to digital converter 40 and one input terminal of the offset voltage corrector 20. The output terminal of the LPF 31 is connected to the inverting terminal of the ΔΣ A/D converter 40 and the other input terminal of the offset voltage corrector 20.

That is, the differential amplifying apparatus shown in FIG. 2 is configured to pass the output signals from the differential amplifier 10 through the LPFs each serving as an anti-aliasing filter and then input the signals to the ΔΣ A/D converter 40 to convert them into digital signals. Note that although a ΔΣ A/D converter has been described above as an example of the A/D converter, an A/D converter of another type may also be used. It is only the ΔΣ A/D converter that has the problem of "tonal noise" with a frequency changing depending on the magnitude of the offset voltage. According to this embodiment, however, the influence of the large offset voltage of an input signal can be reduced even in an A/D converter of another type.

During the correction period, the offset voltage corrector 20 receives an output signal SDM_INP of the LPF 30 and an output signal SDM_INN of the LPF 31 and outputs a correction signal OCAL to eliminate the difference between the output signals. The offset voltage corrector 20 maintains the correction signal OCAL even during the normal operation period after the correction period.

When the correction period is provided before the normal operation period, the differential amplifying apparatus can perform accurate differential amplification without the offset voltage of the differential amplifier 10 during the normal operation period, like the differential amplifying apparatus shown in FIG. 1.

During the normal operation period, the INP terminal and the INN terminal are connected via an input resistance RIN. Hence, the offset component (Dc component) between the signal input to the INP terminal and that input to the INN terminal is cut by a capacitor C. In addition, the input resistance RIN generates a DC short circuit between the +IN terminal and the −IN terminal. For this reason, the reference potentials of the two terminals match, and the offset component is removed. This function is the same as in the differential amplifying apparatus shown in FIG. 1.

Note that although an example in which a reference voltage Vref is input to the −IN terminal of the differential amplifier 10 has been described above, a signal other than the reference voltage may be input.

[Configuration of Offset Voltage Corrector]

The configuration of the offset voltage corrector 20 and its operation will be described with reference to FIGS. 3A and 3B.

Figure 3A:
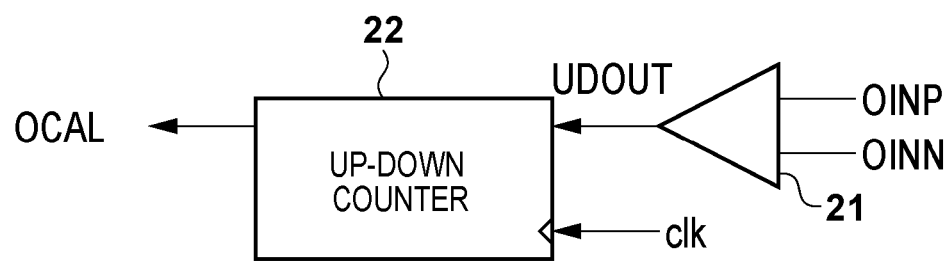
FIGS. 3A and 3B are views for explaining the arrangement and operation of an offset voltage corrector.

As shown in FIG. 3A, the offset voltage corrector 20 includes a comparator 21 having a non-inverting terminal (to be referred to as an OINP terminal hereinafter) and an inverting terminal (to be referred to as an OINN terminal hereinafter), and an up-down counter 22. The up-down counter 22 receives an output UDOUT from the comparator 21 and a clock clk. The count value of the up-down counter 22 is output as the correction signal OCAL.

Figure 3B:
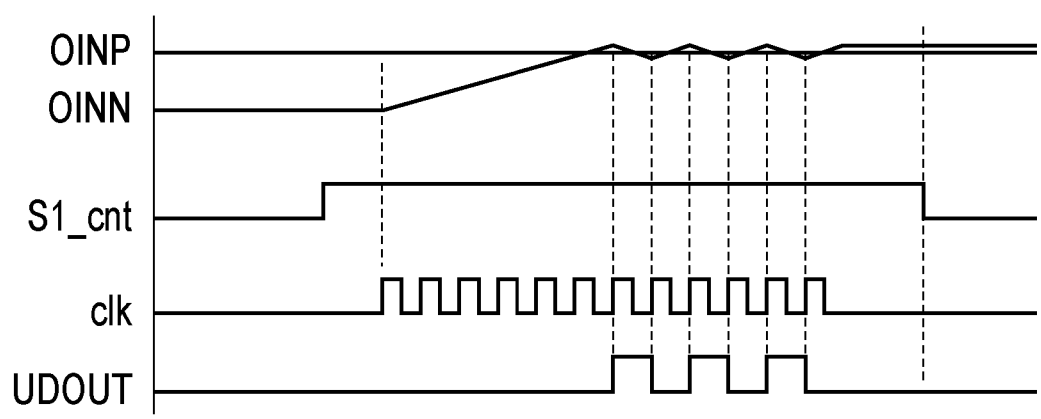

FIG. 3B is a timing chart for explaining the operation of the offset voltage corrector 20. Referring to FIG. 3B, a signal S1_cnt controls the switch S1. When the signal S1_cnt changes to high level "1", the switch S1 connects the INP terminal and the +IN terminal to start the correction period.

During the correction period, the clock clk is input to the up-down counter 22. Upon receiving the clock clk, the up-down counter 22 counts up or down based on the output UDOUT of the comparator 21 representing the result of comparison between the input signal of the OINP terminal and that of the OINN terminal.

FIG. 3B shows a state in which the voltage of the OINP terminal is higher than the voltage of the OINN terminal ($V_{OINP} > V_{OINN}$). In this case, the comparator 21 outputs the signal UDOUT of low level "0". When signal UDOUT="0", the up-down counter 22 counts down. The differential amplifier 10 corrects the offset in accordance with the correction signal OCAL that is the count value, and the voltage of the OINN terminal rises.

When $V_{OINP} \leq V_{OINN}$ due to the raised voltage of the OINN terminal, the signal UDOUT of the comparator 21 is inverted. When signal UDOUT="1", the up-down counter 22 counts up. The differential amplifier 10 corrects the offset in accordance with the correction signal OCAL that is the count value, and the voltage of the OINN terminal drops.

The voltage of the OINN terminal repetitively rises and drops so as to correct the difference between the voltage of the OINP terminal and that of the OINN terminal within the range corresponding to the accuracy of the least significant bit of the up-down counter 22. That is, in the arrangement shown in FIG. 1, the difference between the OUT_P terminal and the OUT_N terminal of the differential amplifier 10 is corrected. In the arrangement shown in FIG. 2, the difference between the output signal SDM_INP of the LPF 30 and the output signal SDM_INN of the LPF 31 is corrected.

Note that any method can be used to correct the offset of the differential amplifier 10 in accordance with the correction signal OCAL output from the up-down counter 22. For example, controlling the value of the current to be supplied to the transistors included in the differential pair of the differential amplifier, controlling the area ratio of the transistors included in the differential pair of the differential amplifier, adjusting the resistance value for setting the output voltage, and the like are usable.

An example in which only the voltage on the OINN terminal side is corrected has been described above with reference to the timing chart of FIG. 3B. However, only the voltage on the OINP terminal side may be corrected, or both the voltages on the OINN and OINP terminal sides may be corrected.

[Another Configuration of Offset Voltage Corrector]

Another configuration of the offset voltage corrector 20 and its operation will be described with reference to FIGS. 4A and 4B.

Figure 4A:
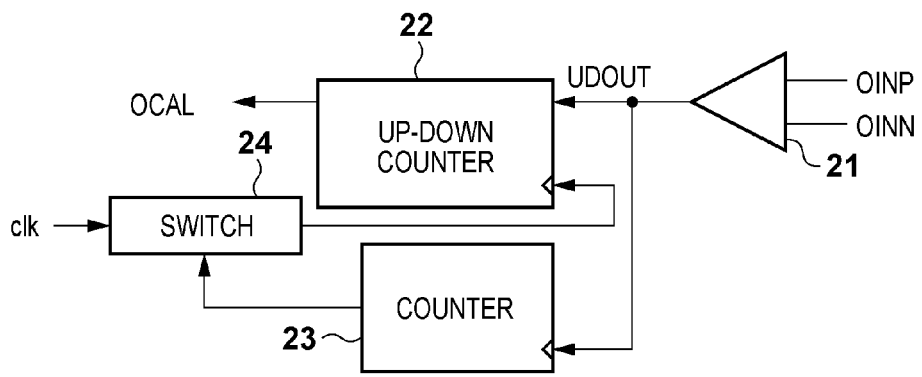
FIGS. 4A and 4B are views for explaining another arrangement and operation of the offset voltage corrector.

In the offset voltage corrector 20 shown in FIG. 4A, a counter 23 (second counter) and a switch 24 are added to the arrangement of the comparator 21 and the up-down counter 22 (first counter) shown in FIG. 3A. The output UDOUT from the comparator 21 is input to the clock input terminal of the counter 23. The switch 24 selectively supplies the clock clk to the up-down counter 22 or fixes the clock clk to low level in accordance with an output COUT from the counter 23.

Figure 4B:
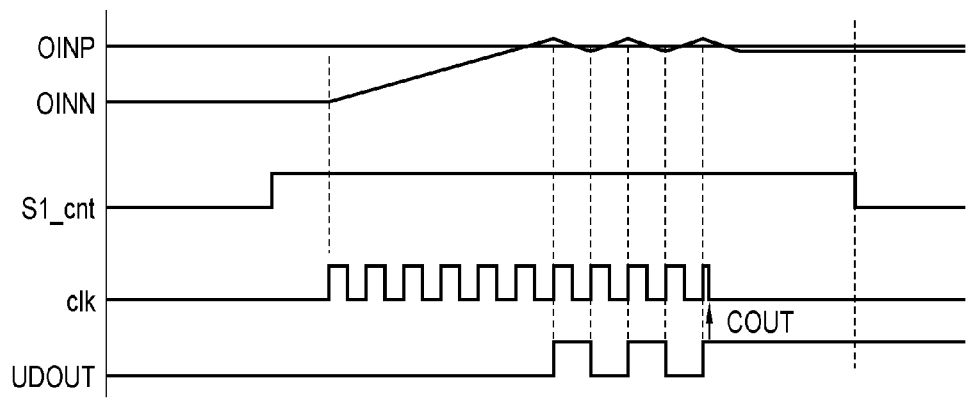

FIG. 4B is a timing chart for explaining the operation of the offset voltage corrector 20. Note that a description of the same portions as those of the operation shown in FIG. 3B will be omitted.

In the initial state, the switch 24 supplies the clock clk to the up-down counter 22. The counter 23 counts the output UDOUT from the comparator 21. Hence, when the output UDOUT of the comparator 21 repetitively changes to "1" and "0" after sufficient offset correction has been done, the count value of the counter 23 increases. When the count value of the counter 23 reaches a predetermined value, the output COUT of the counter 23 changes to "1", and the switch 24 fixes the clock clk to the up-down counter 22 to low level.

When the counter 23 is configured to count up at the leading edge of the output UDOUT of the comparator 21, and the count value to set the output COUT of the counter 23 to "1" is appropriately set, the end timing of offset correction can be controlled. That is, the timing can be controlled to end the offset correction in the state in which the voltage on the OINP terminal side is high or end the offset correction in the state in which the voltage on the OINN terminal side is high. An example will be described here in which the counter counts up in synchronism with the leading edge of the output UDOUT of the comparator 21. However, the counter may count up in synchronism with the trailing edge of the output UDOUT or in synchronism with the leading and trailing edges of the output UDOUT.

In the example shown in FIG. 4B, supplying the clock clk stops at the leading edge of the signal UDOUT. When the clock clk is fixed to low level, the change of the correction signal OCAL output from the up-down counter 22 also stops. The correction signal OCAL at the point of time the clock clk is almost fixed to low level is maintained. As a result, the difference between the voltage of the OINP terminal and that of the OINN terminal also maintains the value corresponding to the correction signal OCAL.

According to the arrangement of the offset voltage corrector 20 shown in FIG. 3A, the difference between the voltage of the OINP terminal and that of the OINN terminal converges within the range corresponding to the accuracy of the least significant bit of the up-down counter 22, as described above. On the other hand, according to the arrangement of the offset voltage corrector 20 shown in FIG. 4A, the difference between the voltage of the OINP terminal and that of the OINN terminal can be halved as compared to the arrangement shown in FIG. 3A.

[Still Another Configuration of Offset Voltage Corrector]

Still another configuration of the offset voltage corrector 20 and its operation will be described with reference to FIG. 5.

Figure 5:
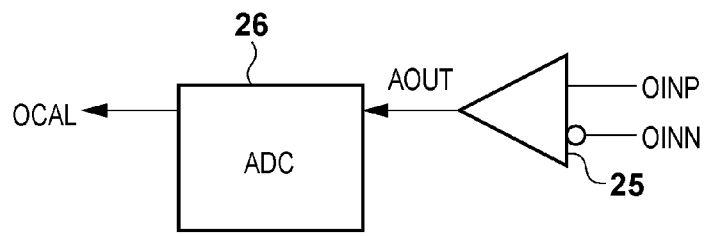
FIG. 5 is a block diagram for explaining still another arrangement of the offset voltage corrector.

Referring to FIG. 5, the OINP terminal is connected to the +IN terminal of an operational amplifier (differential amplifier) 25 of the offset voltage corrector 20, and the OINN terminal is connected to the −IN terminal. An A/D converter (ADC) 26 receives an output signal AOUT from the operational amplifier 25 and outputs the correction signal OCAL.

When the correction period starts, the operational amplifier 25 outputs the output signal AOUT by amplifying the difference between the voltage of the OINP terminal and that of the OINN terminal. The ADC 26 converts the output signal AOUT into the digital correction signal OCAL. Based on the digital correction signal OCAL, the differential amplifier 10 corrects the offset to eliminate the difference between the voltage of the OINP terminal and that of the OINN terminal.

When the voltage of the OINP terminal and that of the OINN terminal change, the output signal AOUT of the operational amplifier 25 changes, and the digital correction signal OCAL output from the ADC 26 also changes. The change is repeated to correct the offset of the differential amplifier 10. The offset voltage corrector 20 maintains the value of the digital correction signal OCAL during the normal operation period after the correction period.

As described above, during the offset correction period, offset correction is performed by inputting identical signals to the +IN terminal and the −IN terminal of the differential amplifier 10. During the normal operation period, the offset correction signal OCAL is maintained to suppress the offset voltage.

Note that the above-described embodiments are merely examples of practicing the present invention and should not limit the interpretation of the technical scope of the present invention. That is, the present invention can be practiced in various forms without departing from its technical scope or main features.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-031265, filed Feb. 16, 2011, which is hereby incorporated by reference herein in its entirety.

What is claimed is:

1. A differential amplifying apparatus comprising:
a differential amplifier which amplifies a difference between a signal input to a first input terminal via a capacitor and a signal input to a second input terminal;
a switch which switches whether to input the signal to the first input terminal via the capacitor;
a resistance which is connected between the first input terminal and the second input terminal;
a corrector which corrects an offset voltage of the differential amplifier based on an output signal of the differential amplifier during a correction period in which the switch is controlled not to input the signal to the first input terminal via the capacitor.

2. The apparatus according to claim 1, wherein the corrector maintains correction of the offset voltage during a normal operation period in which the switch is controlled to input the signal to the first input terminal via the capacitor after the correction period.

3. The apparatus according to claim 1, wherein the differential amplifier comprises a fully-differential amplifier, and
the corrector receives a signal from a first output terminal of the fully-differential amplifier and a signal from a second output terminal of the fully-differential amplifier and performs the correction so as to make a difference between the signal of the first output terminal and the signal of the second output terminal smaller during the correction period.

4. The apparatus according to claim 3, wherein the signal of the first output terminal and the signal of the second output terminal are supplied to an analog to digital converter.

5. The apparatus according to claim 3, further comprising low pass filters which are arranged between the first output terminal and the corrector and between the second output terminal and the corrector, respectively.

6. The apparatus according to claim 5, wherein a signal output from each of the low pass filters is supplied to an analog to digital converter.

7. The apparatus according to claim 3, wherein the corrector comprises a comparator for comparing the signal of the first output terminal with the signal of the second output terminal, and a first counter for counting up and down a clock based on an output from the comparator, and
the corrector performs the correction based on a count value of the first counter.

8. The apparatus according to claim 7, wherein the corrector further comprises a second counter which counts the output from the comparator, and a unit which stops supplying the clock to the first counter when a count value of the second counter reaches a predetermined value.

9. The apparatus according to claim 3, wherein the corrector comprises an operational amplifier which applies the difference between the signal of the first output terminal and the signal of the second output terminal, and a unit which converts an output from the operational amplifier into a digital signal, and
the corrector performs the correction based on the digital signal.

* * * * *